US012224200B2

(12) United States Patent
Jeong et al.

(10) Patent No.: US 12,224,200 B2
(45) Date of Patent: Feb. 11, 2025

(54) SUBSTRATE TREATING APPARATUS

(71) Applicant: SEMES CO., LTD., Chungcheongnam-do (KR)

(72) Inventors: Ji Hoon Jeong, Hwaseong-si (KR); Won-Geun Kim, Goyang-si (KR); Young Dae Chung, Incheon (KR); Jee Young Lee, Suwon-si (KR); Tae Shin Kim, Suwon-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 861 days.

(21) Appl. No.: 17/394,868

(22) Filed: Aug. 5, 2021

(65) Prior Publication Data
US 2022/0068698 A1  Mar. 3, 2022

(30) Foreign Application Priority Data
Aug. 25, 2020  (KR) .................. 10-2020-0106800

(51) Int. Cl.
*H01L 21/687* (2006.01)
*H01L 21/67* (2006.01)

(52) U.S. Cl.
CPC .. *H01L 21/68764* (2013.01); *H01L 21/67098* (2013.01)

(58) Field of Classification Search
CPC ......... H01L 21/68764; H01L 21/67098; H01L 21/6704; H01L 21/67115; H01L 21/67051; H01L 21/68792; H01L 21/6708; H01L 21/6875; H01L 21/68757; B23K 26/0648; B23K 26/103
See application file for complete search history.

(56) References Cited

U.S. PATENT DOCUMENTS

2011/0284510 A1\* 11/2011 Reeves-Hall ...... B23K 26/0853
219/121.72
2020/0251359 A1\* 8/2020 Wakabayashi ....... B23K 26/352

FOREIGN PATENT DOCUMENTS

| JP | 2003031517 A | 1/2003 |
|---|---|---|
| JP | 2013-153061 A | 8/2013 |
| JP | 5294916 B2 | 9/2013 |
| JP | 2014515501 A | 6/2014 |
| KR | 1020140135127 A | 11/2014 |
| KR | 1020160099165 A | 8/2016 |
| KR | 10-2008311 B1 | 8/2019 |
| KR | 1020210047010 A | 4/2021 |
| WO | WO2004112107 A1 | 12/2004 |

OTHER PUBLICATIONS

Korean Patent Office, Office action issued on Oct. 25, 2022.
Korean Patent Office, Notice of Allowance issued on Apr. 6, 2023.

\* cited by examiner

*Primary Examiner* — Robert G Bachner
(74) *Attorney, Agent, or Firm* — Li & Cai Intellectual Property (USA) Office

(57) ABSTRACT

The present disclosure provides a substrate treating apparatus. The substrate treating apparatus includes a support unit that supports a substrate, and a heating unit that irradiates a beam to the substrate and heat the substrate, and the heating unit further includes an irradiation part that irradiates the beam, and a rotation part that rotates the beam.

16 Claims, 11 Drawing Sheets

Lens 45°

SUBSTRATE TREATING APPARATUS

CROSS-REFERENCE TO RELATED APPLICATIONS

A claim for priority under 35 U.S.C. § 119 is made to Korean Patent Application No. 10-2020-0106800 filed on Aug. 25, 2020, in the Korean Intellectual Property Office, the entire contents of which are hereby incorporated by reference.

BACKGROUND

Embodiments of the inventive concept described herein relate to a substrate treating apparatus.

In general, in process of manufacturing flat panel display devices or semiconductors, various processes such as a photoresist coating process, a developing process, an etching process, and an ashing process are performed in a process of treating a glass substrate or a wafer. The processes include a wet cleaning process using chemicals or deionized water and a drying process for drying the chemicals or the deionized water that is left on a surface of a substrate, in order to remove various contaminants attached to the substrate.

In recent years, etching processes of selectively removing a silicon nitride film and a silicon oxide film by using a chemical, such as sulfuric acid or phosphoric acid, which is used at a high temperature have been performed. As a substrate treating apparatus using a chemical of high temperature, a substrate treating apparatus that heats a substrate has been used to improve etching rate. An example of the above-described substrate treating apparatus is disclosed in Korean Patent Application Publication No. 2014-0135127. According to the above patent, the substrate treating apparatus has a spin chuck that supports and rotates a substrate, and an IR lamp that heats the substrate. Furthermore, the IR lamp is mounted in a scheme of being stopped with relative to the rotation of the spin chuck. That is, according to the above patent, the IR lamp generates heat at a fixed location and the substrate is rotated so that the substrate may be uniformly heated.

However, uniform heating may be achieved with respect to the axis of rotation of the substrate when the substrate is rotated, but the uniformity of the heating of the substrate deteriorates when the rotational speed of the substrate become lower. Furthermore, the rotational speed of the substrate acts as an important factor for determining the thickness of the liquid film formed by the chemical and the flow velocity of the chemical. In other words, the rotational speed of the substrate acts as a factor that influences all of the heating uniformity of the substrate, the flow velocity of the chemical supplied onto the substrate, and the thickness of the liquid film formed on the substrate. For example, when the rotational speed of the substrate is increased to increase the heating uniformity of the substrate, the thickness of the liquid film formed on the substrate cannot be adjusted to a desired thickness. In contrast, when the rotational speed of the substrate is adjusted to adjust the thickness of the liquid film formed on the substrate to a desired thickness, the heating uniformity of the substrate may deteriorate.

SUMMARY

Embodiments of the inventive concept provide a substrate treating apparatus that may efficiently treat a substrate.

Embodiments of the inventive concept also provide a substrate treating apparatus that may efficiently heat a substrate.

Embodiments of the inventive concept also provide a substrate treating apparatus that may increase a heating uniformity of a substrate.

Embodiments of the inventive concept also provide a substrate treating apparatus that may increase a heating uniformity of a substrate without rotating the substrate.

Embodiments of the inventive concept also provide a substrate treating apparatus that may minimize generation of a deviation in a thickness of a liquid film formed on a substrate.

The aspect of the inventive concept is not limited thereto, and other unmentioned aspects of the present invention may be clearly appreciated by those skilled in the art from the following descriptions.

The present disclosure provides a substrate treating apparatus. The substrate treating apparatus includes a support unit that supports a substrate, and a heating unit that irradiates a beam to the substrate and heats the substrate, and the heating unit further includes an irradiation part that irradiates the beam, and a rotation part that rotates the beam.

According to an embodiment, the rotation part may include a cylindrical lens located on a travel path of the beam irradiated by the irradiation part and which is rotatable.

According to an embodiment, a pair of cylindrical lenses may be provided and rotational directions of the cylindrical lenses may be the same.

According to an embodiment, each of the cylindrical lenses may have a shape, one surface of which is a planar surface that is flat, and an opposite surface of which is a curved surface.

According to an embodiment, the planar surface of any one of the pair of cylindrical lenses and the planar surface of the other of the pair of cylindrical lenses may face each other.

According to an embodiment, the heating unit may further include a reflection part that reflects the beam that passed through the rotation part in a direction that faces the substrate.

According to an embodiment, the reflection part may include a reflective mirror, of which a surface, to which the beam is input, has a flat or deflected shape.

According to an embodiment, the heating unit may further include a dispersion part that disperses the beam reflected by the reflection part.

According to an embodiment, the dispersion part may include a lens barrel, and one or more dispersion lenses housed in the lens barrel.

According to an embodiment, a plurality of dispersion lenses may be provided, and a relative distance of the plurality of dispersion lenses may be variable.

According to an embodiment, the support unit may further include a transmission plate formed of a transparent material, and a chuck pin that chucks the substrate while an upper surface of the transmission plate and a lower surface of the substrate are spaced apart from each other, and the beam irradiated by the irradiation part may be irradiated to the lower surface of the substrate.

According to an embodiment, the support unit may further include a support member that supports an edge of the transmission plate, and a rotation member that rotates the support member.

The present disclosure provides a substrate treating apparatus. The substrate treating apparatus includes a support unit that supports a substrate and optionally rotates the substrate, a liquid supply unit that supplies a treatment liquid to the substrate, and a heating unit that irradiates a beam to the substrate and heats the substrate, and the heating unit includes an irradiation part that irradiates the beam, and a rotation part that rotates the beam.

According to an embodiment, the support unit may further include a transmission plate formed of a transparent material, and a chuck pin that chucks the substrate while an upper surface of the transmission plate and a lower surface of the substrate are spaced apart from each other, and the beam irradiated by the irradiation part may be irradiated to the lower surface of the substrate.

According to an embodiment, the support unit may further include a support member that supports an edge of the transmission plate, and a rotation member that rotates the support member.

According to an embodiment, the rotation part may include a cylindrical lens located on a travel path of the beam irradiated by the irradiation part and which is rotatable.

According to an embodiment, a pair of cylindrical lenses are provided and rotational directions of the cylindrical lenses may be the same.

According to an embodiment, each of the cylindrical lenses may have a shape, one surface of which is a planar surface that is flat, and an opposite surface of which is a curved surface.

The present disclosure provides a substrate treating apparatus. The substrate treating apparatus includes a support member that supports a substrate and formed of a transparent material, and a heating unit that heats the substrate by irradiating a laser beam to a lower surface of the substrate supported by the support member, the heating unit includes an irradiation part that irradiates the laser beam, and a rotation part that rotates the laser beam, and the rotation part includes a cylindrical lens located on a travel path of the laser beam irradiated by the irradiation part and which is rotatable.

According to an embodiment, rotational directions of the cylindrical lenses may be the same, and each of the cylindrical lenses may have a shape, one surface of which is a planar surface that is flat, and an opposite surface of which is a curved surface.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
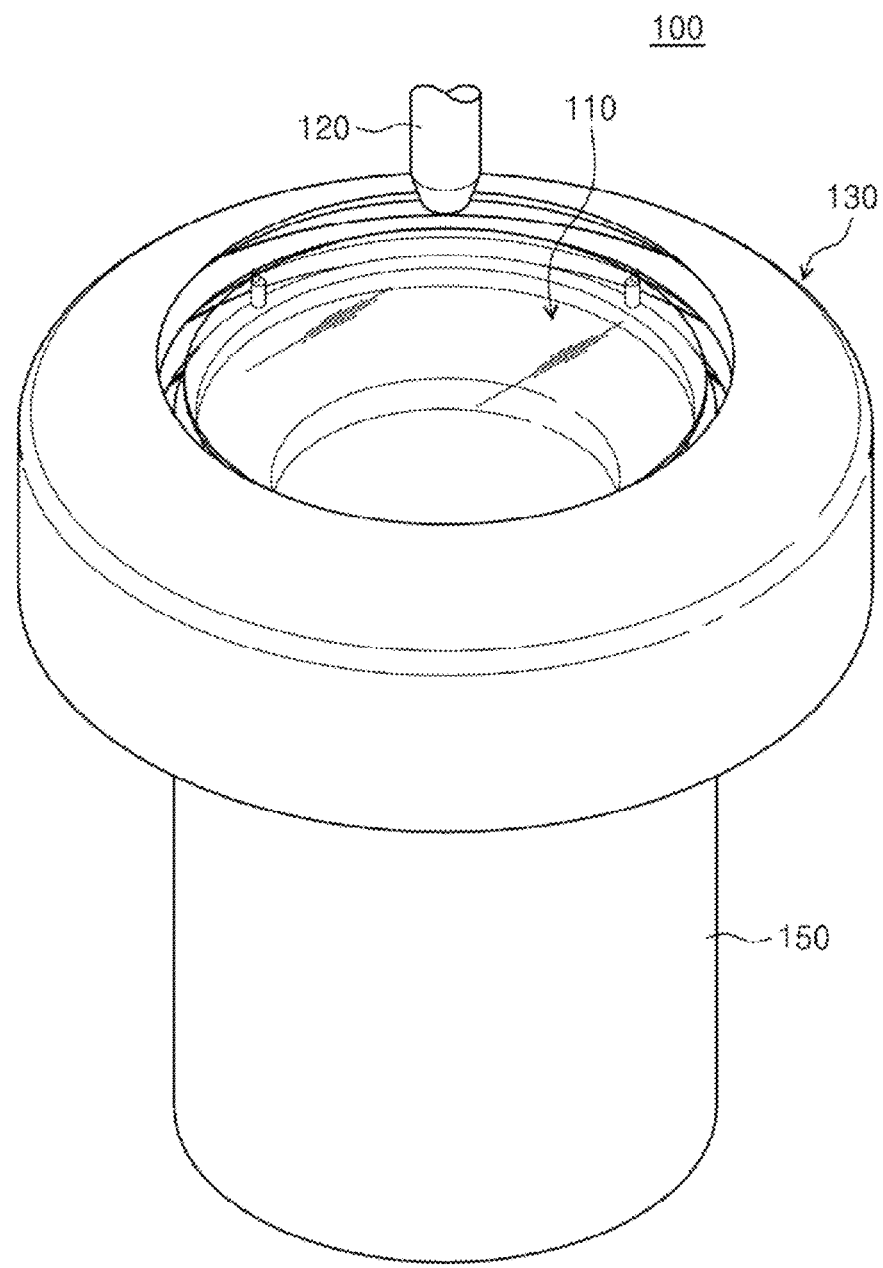
FIG. 1 is a view illustrating a substrate treating apparatus according to an embodiment of the inventive concept.

Hereinafter, exemplary embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. Furthermore, in a description of the embodiments of the inventive concept, a detailed description of related known functions or configurations will be omitted when they make the essence of the inventive concept unnecessarily unclear. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The terms of a singular form may include plural forms unless otherwise specified. Furthermore, in the drawings, the shapes and sizes of the elements may be exaggerated for clearer description.

Hereinafter, embodiments of the inventive concept will be described with reference to FIGS. 1 to 17.

Figure 2:
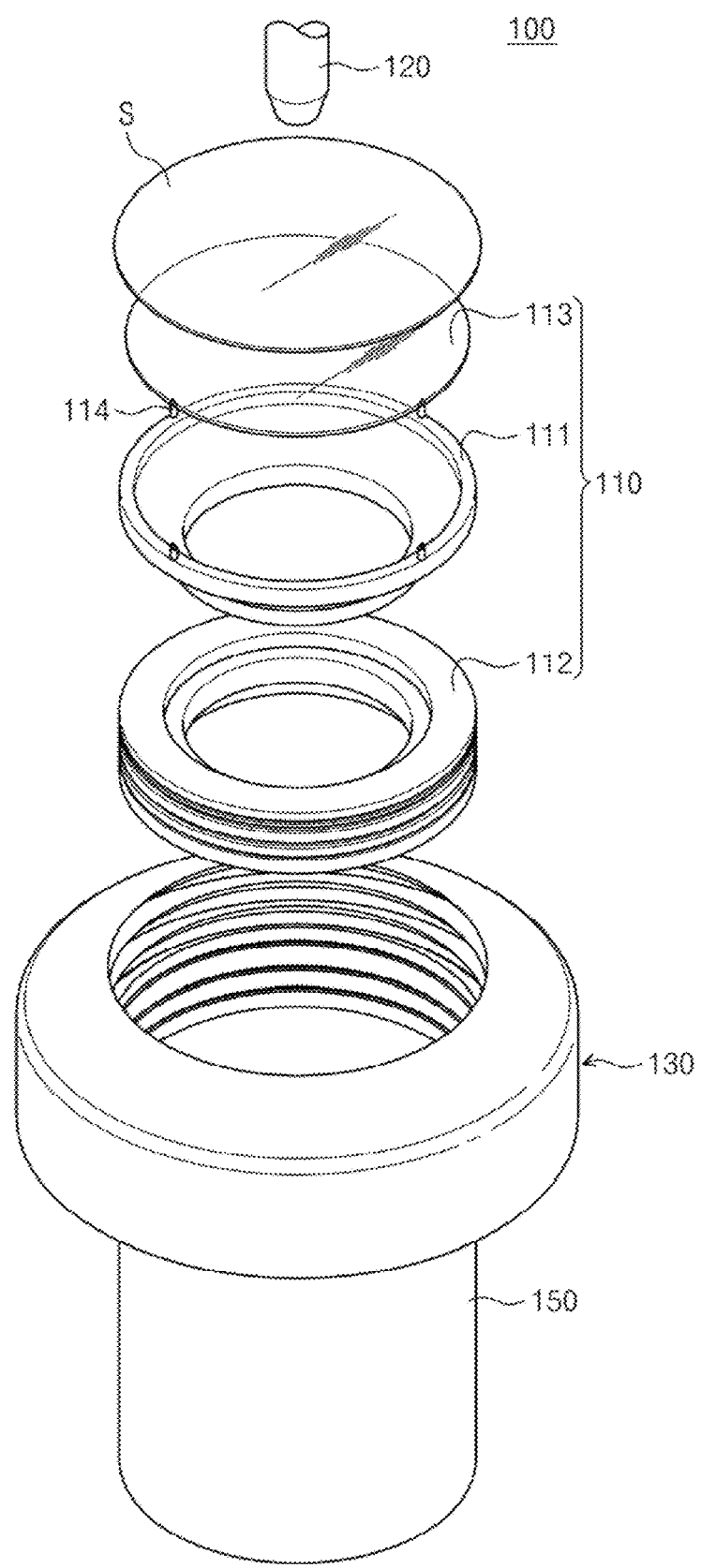
FIG. 2 is an exploded perspective view, in which a part of the substrate treating apparatus of FIG. 1 is disassembled.
Figure 3:
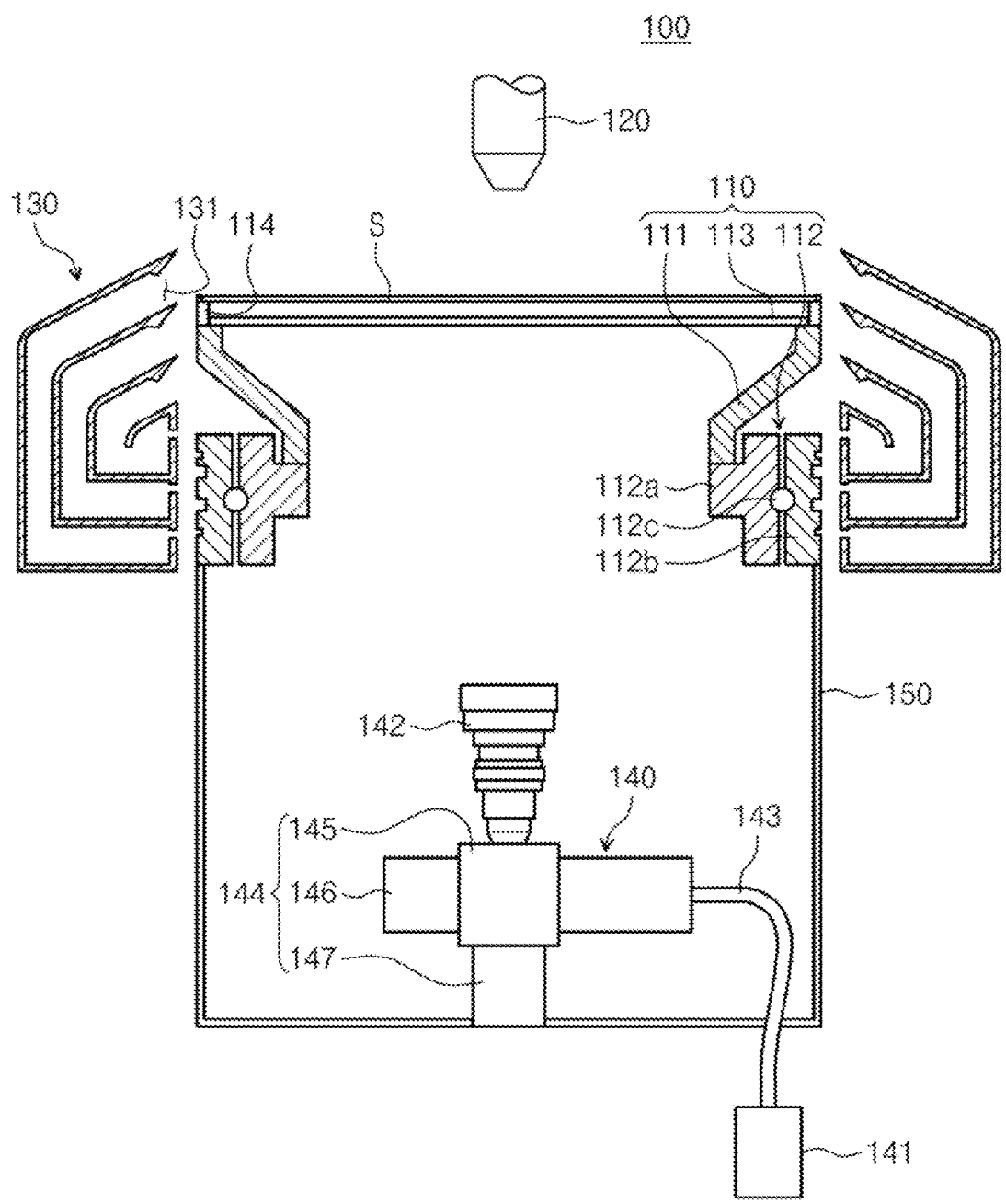
FIG. 3 is a cross-sectional view illustrating the substrate treating apparatus of FIG. 1.

FIG. 1 is a view illustrating a substrate treating apparatus according to an embodiment of the inventive concept. FIG. 2 is an exploded perspective view, in which a part of the substrate treating apparatus of FIG. 1 is disassembled. FIG. 3 is a cross-sectional view illustrating the substrate treating apparatus of FIG. 1. Referring to FIGS. 1 to 3, a substrate treating apparatus 100 according to the embodiment of the inventive concept may supply a treatment liquid to the substrate "S" and treat the substrate "S" with the liquid.

Furthermore, the substrate treating apparatus 100 may heat the substrate "S" by irradiating a laser beam "L" to the substrate "S".

The substrate treating apparatus 100 may include a support unit 110, a liquid supply unit 120, a bowl 130, a heating unit 140, and a housing 150.

The support unit 110 may support the substrate "S". The support unit 110 may rotate the substrate "S". The support unit 110 may include a support member 111, a rotation member 112, a transmission plate 113, and a chuck pin 114.

The support member 111 may have a tub shape, of which an upper side and a lower side are opened. The support member 111 may have a shape having an upper side having a diameter that is larger than that of a lower side. For example, the support member 111 may have a shape including a part having a constant diameter, a part, a diameter of which gradually decreases, and a part having a constant diameter again, when viewed from the upper side to the lower side. Furthermore, the transmission plate 113, which will be described below, may be positioned on an upper end of the support member 111. Furthermore, a lower end of the support member 111 may be coupled to the rotation member 112, which will be described below.

The rotation member 112 may rotate the support member 111. The rotation member 112 may generate a driving force that rotates the support member 111. Further, the rotation member 112 may have a hollow ring shape when viewed from the top. For example, the rotation member 112 may be a hollow motor. The rotation member 112 may include a rotor 112a, a stator 112b, and a bearing 112c.

The rotor 112a may be coupled to a lower end of the support member 111 to be rotated together with the support member 111. The stator 112b may be fixedly coupled to an upper end of the housing 150, which will be described below. The stator 112b may generate a driving force that rotates the rotor 112a. Furthermore, the bearing 112c may be provided between the stator 112b and the rotor 112a for smooth relative rotation of the stator 112b and the rotor 112a.

The transmission plate 113 may be positioned on the upper end of the support member 111. The transmission plate 113 may be coupled to the support member 111. For example, an edge of the transmission plate 113 may be supported by the support member 111. Furthermore, the transmission plate 113 may be formed of a transparent material. The transmission plate 113 may be formed of a material having an excellent anti-chemical property for the treatment liquid supplied by the liquid supply unit 120. For example, the transmission plate 113 may be formed of a quartz or glass material.

The chuck pin 114 may chuck the substrate "S". The chuck pin 114 may chuck substrate "S" in a state, in which the lower surface of the substrate "S" is spaced apart from an upper surface of the transmission plate 113. Furthermore, the chuck pin 114 may support the lower surface and/or a side part of the substrate "S". The chuck pin 114 may be installed in the support member 111. The chuck pin 114 may be installed at the upper end of the support member 111. Further, a plurality of chuck pins 114 may be provided. Furthermore, the chuck pins 114 may be installed in the support member 111 to be spaced apart from each other. For example, the chuck pins 114 may be installed in the support member 111 to be spaced apart from each other at the same interval.

The liquid supply unit 120 may supply the treatment liquid to the substrate "S". The liquid supply unit 120 may include a nozzle that discharges the treatment liquid. The liquid supply unit 120 may supply the heated treatment liquid to the substrate "S". Furthermore, the treatment liquid may be a chemical that treats the surface of the substrate "S". For example, the chemical may be a chemical for etching the surface of the substrate "S". As an example, the chemical may be a treatment liquid including at least any one of sulfuric acid, nitric acid, phosphoric acid, a mixture solution of sulfuric acid and phosphoric acid, ammonium hydroxide, oxygenated water, and water.

The bowl 130 may recover the treatment liquid supplied by the liquid supply unit 120. For example, the bowl 130 may recover the treatment liquid that spatters from the substrate "S". Furthermore, the bowl 130 may be a multi-stepped bowl. For example, the bowl 130 may include an outer container, an intermediate container, and an inner container. Each of the containers may include a bottom part, a side wall extending in a direction that is perpendicular to the bottom part, and an inclined part extending inclined upwards toward a direction that faces from the side wall to the support unit 110. Furthermore, the inclined parts of the adjacent containers may define an inlet 131, through which the treatment liquid is introduced. The bowl 130 is a multi-stepped bowl, and thus a plurality of inlets 131 may be formed. The treatment liquid introduced through the inlet 131 may be provided to an external liquid recycling part (not illustrated) through a recovery line, which is not illustrated, to be reused. The liquid recycling part may be a device that recycles the treatment liquid by adjusting the concentration of the used treatment liquid, adjusting the temperature of the used treatment liquid, and filtering out contaminants, in order to reuse the treatment liquid.

Furthermore, the bowl 130 may be moved upwards and downwards. Accordingly, the bowl 130 may recover the treatment liquid while determining the inlet 131 differently according to the treatment liquid that is to be recovered. For example, when a first treatment liquid is to be recovered, the bowl 130 may be moved such that the inlet 131 defined by the inclined parts of the outer container and the inner container are located outside the edge of the substrate "S". For example, when a second treatment liquid is to be recovered, the bowl 130 may be moved such that the inlet 131 defined by the inclined parts of the intermediate container and the inner container are located outside the edge of the substrate "S". Although it has been described as an example, in the above-described example, that the bowl 130 is moved upwards and downwards, the present disclosure is not limited thereto. For example, the present disclosure may be modified to various embodiments for changing the relative height between the bowl 130 and the support unit 110.

The heating unit 140 may heat the substrate "S". The heating unit 140 may heat the substrate "S" by irradiating a laser beam to the substrate "S". The upper sides of at least some configurations of the heating unit 140 may be opened, and may be provided in the housing 150 disposed under the support unit 110. Accordingly, the heating unit 140 may irradiate the beam to the lower surface of the substrate "S". For example, the laser beam "L" irradiated by an irradiation part 141 of the heating unit 140, which will be described below, may be irradiated to the lower surface of the substrate "S".

Figure 4:
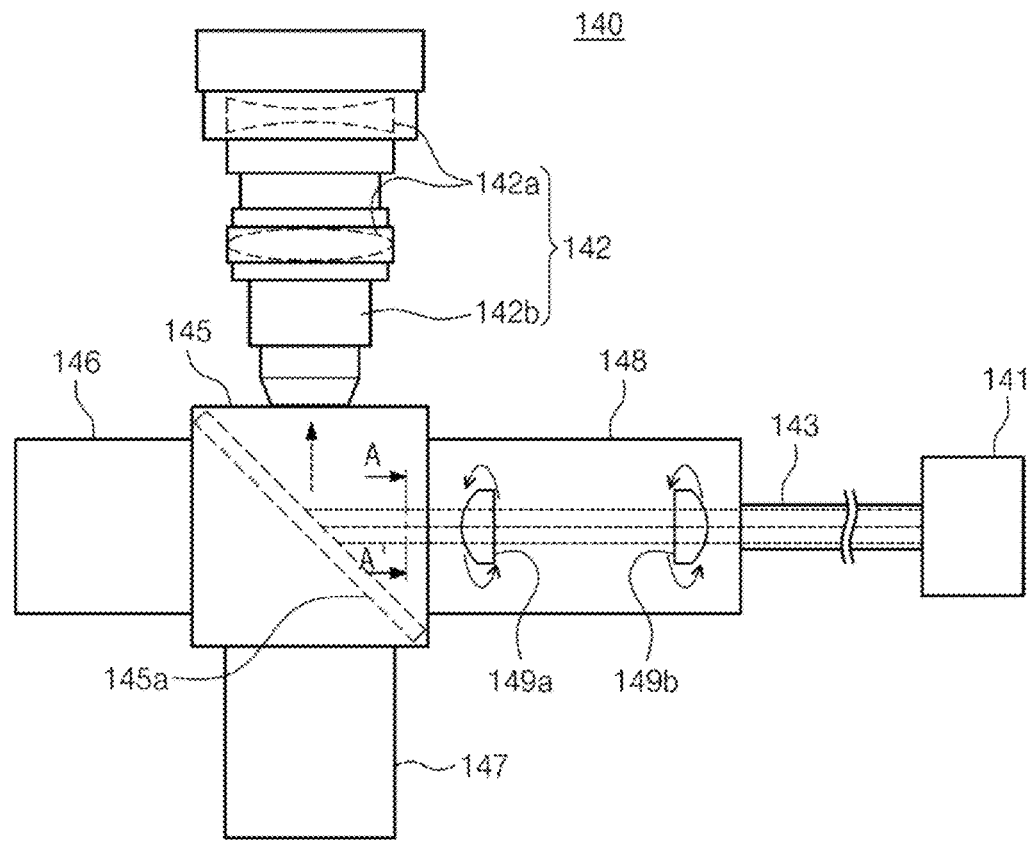
FIG. 4 is a view illustrating a heating unit of FIG. 3.

FIG. 4 is a view illustrating a heating unit of FIG. 3. Referring to FIG. 4, the heating unit 140 may include the irradiation part 141, a dispersion part 142, an optical fiber 143, a reflection part 145, an imaging part 146, a detection part 147, and a rotation part 148.

The irradiation part 141 may irradiate the beam. The beam irradiated by the irradiation part 141 may be a laser beam.

The irradiation part 141 may change a wavelength of the beam. For example, the irradiation part 141 may irradiate a beam having a wavelength, of which the absorption rate for the substrate "S" is high. For example, when the substrate "S" is a wafer formed of a material including Si, the irradiation part 141 may irradiate the beam, of which the absorption rate for Si is high.

The dispersion part 142 may disperse the beam irradiated by the irradiation part 141. For example, the dispersion part 142 may be a beam shaper or an optical system. The dispersion part 142 may disperse the beam after the beam irradiated by the irradiation part 141 is delivered to the reflection part 145, which will be described below and received by the dispersion part 142. The dispersion part 142 may adjust the dispersion of the laser beam. For example, the dispersion part 142 may adjust enlargement of the laser beam, radial dispersion of the beam, and the like. For example, the dispersion part 142 may refract the beam. The dispersion part 142 may include a plurality of dispersion lenses 142a and a lens barrel 142b. The plurality of dispersion lenses 142a may be housed in the lens barrel 142b. Furthermore, a relative distance between the dispersion lenses 142a may vary. Accordingly, the laser beam "L" irradiated by the irradiation part 141 may be refracted while passing through the dispersion part 142, and may be uniformly irradiated to the lower surface of the substrate "S".

FIG. 4 illustrates two dispersion lenses 142a as an example, but the present disclosure is not limited thereto. For example, the number of the dispersion lenses 142a and the kinds of the dispersion lenses 142a (a convex lens, a concave lens, and the like) may be variously selected according to designs.

The optical fiber 143 may deliver the laser beam generated by the irradiation part 141 to the rotation part 148, which will be described below.

The reflection part 145 may include a reflective mirror 145a that reflects the laser beam that passed through the rotation part 148. The reflective mirror 145a may be installed to be rotated by an angle of 45 degrees with respect to an input direction of the beam. The reflective mirror 145a may have a flat shape, in which the surface of the reflective mirror 145a, to which the beam is input, is flat, or have a curved shape, in which the surface of the reflective mirror 145a, to which the beam is input, is deflected. Furthermore, a portion of the beam input to the reflective mirror 145a may be delivered to the dispersion part 142 after being reflected, and another portion of the beam input to the reflective mirror 145a may be delivered to the imaging part 146.

The imaging part 146 may be coupled to the reflection part 145, and may photograph the laser beam that passes through the reflection part 145 and convert the captured image to image data. The imaging part 146 may perform an inspection by analyzing the image data to determine whether the laser beam output from the irradiation part 141 is suitable for the design.

The detection part 147 may be coupled to the reflection part 145, and may detect an intensity (output) of the laser beam input to the reflection part 145.

The detection part 147, for example, may be a photo detector. When the output of the laser beam is excessively strong, the substrate "S" may be heated abruptly. Further, when the output of the laser beam is excessively weak, a long time may be taken until the substrate "S" is heated. The detection part 147 may determine whether the output of the laser beam is a proper value.

The rotation part 148 may rotate the laser beam "L" generated by the irradiation part 141. The rotation part 148 may include a pair of cylindrical lenses 149a and 149b.

Figure 5:
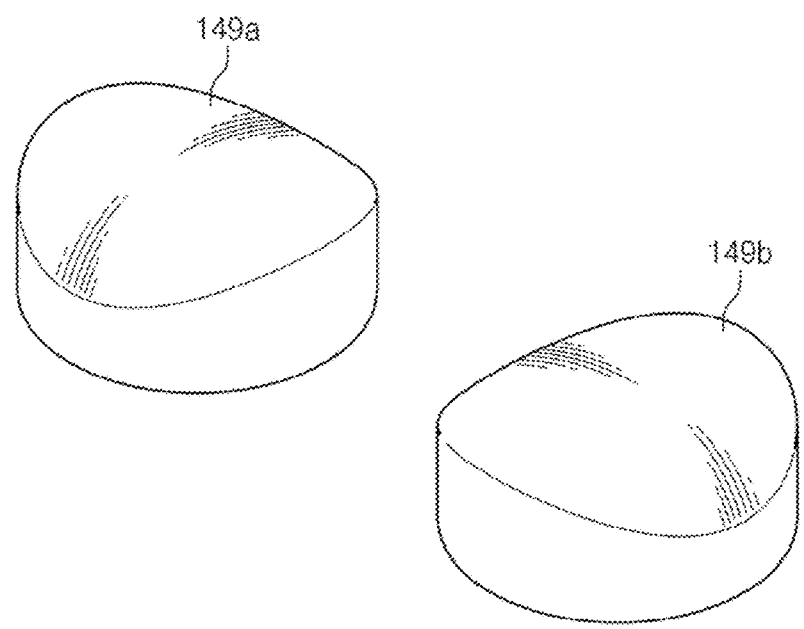
FIG. 5 is a view illustrating cylindrical lenses of FIG. 4.

The pair of cylindrical lenses 149a and 149b may be located on a travel path of the laser beam "L" irradiated by the irradiation part 141. The pair of cylindrical lenses 149a and 149b may be configured to be rotated by a rotation mechanism, which is not illustrated. The rotational directions of the pair of cylindrical lenses 149a and 149b may be the same. The pair of cylindrical lenses 149a and 149b may have the same axis of rotation. As illustrated in FIG. 5, one surface of each of the pair of cylindrical lenses may have a flat planar surface, and an opposite surface thereof may have a shape having a curved surface. A planar surface of any one 149a of the pair of cylindrical lenses 149a and 149b and a planar surface of the other 149b of the pair of cylindrical lenses 149a and 149b may face each other.

Figure 6:
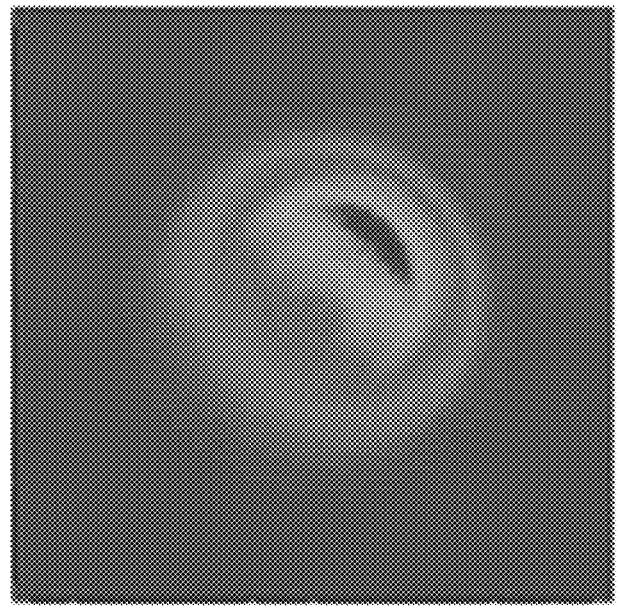
FIG. 6 is a view obtained by viewing a beam in cross-section A-A' when the cylindrical lenses of FIG. 4 are not rotated.

FIG. 6 is a view obtained by viewing a beam in cross-section A-A' when the cylindrical lenses of FIG. 4 are not rotated. Referring to FIG. 6, when the cylindrical lenses 149a and 149b are not rotated, the laser beam "L" that passes through cross-section A-A' may be asymmetric with respect the optical axis thereof, and may be an uneven laser beam "L".

Figure 7:
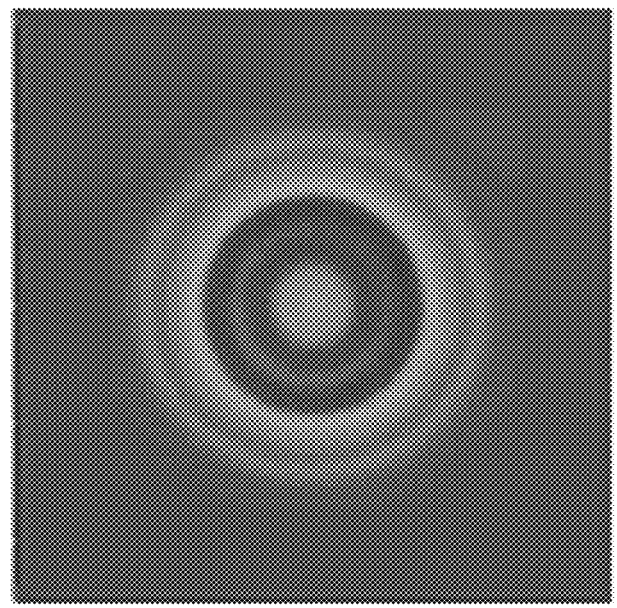
FIG. 7 is a view obtained by viewing a beam in cross-section A-A' when the cylindrical lenses of FIG. 4 are rotated.

FIG. 7 is a view obtained by viewing a beam in cross-section A-A' when the cylindrical lenses of FIG. 4 are rotated. Referring to FIG. 7, when the cylindrical lenses 149a and 149b are rotated, the laser beam "L" that passes through cross-section A-A' may be symmetric with respect the optical axis thereof, and may be a uniform laser beam "L". That is, as the cylindrical lenses 149a and 149b are rotated, the laser beam "L" is rotated. That is, according to the embodiment of the inventive concept, because the uneven laser beam "L" that is asymmetric with respect to the optical axis also is input to the reflection part 145 in a state of the uniform laser beam "L" that is symmetric with respect to the optical axis, uniform accumulated heating may be performed on the substrate "S".

Figure 8:
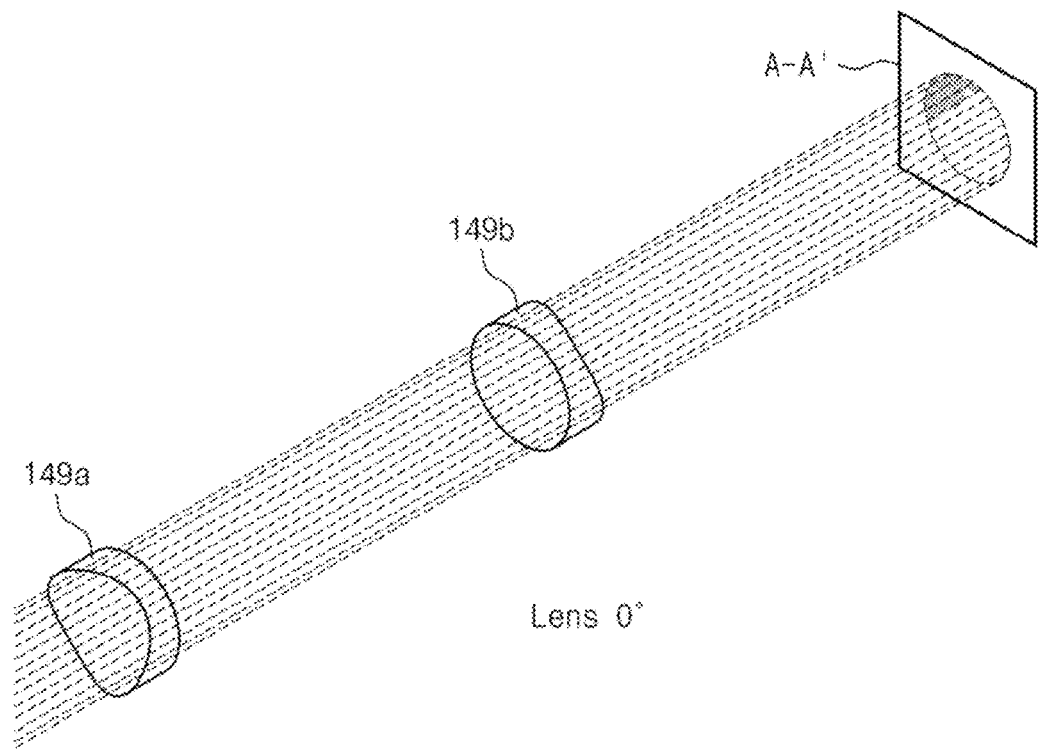
FIG. 8 is a conceptual view illustrating a travel of a beam when the cylindrical lenses are rotated by 0 degrees.
Figure 9:
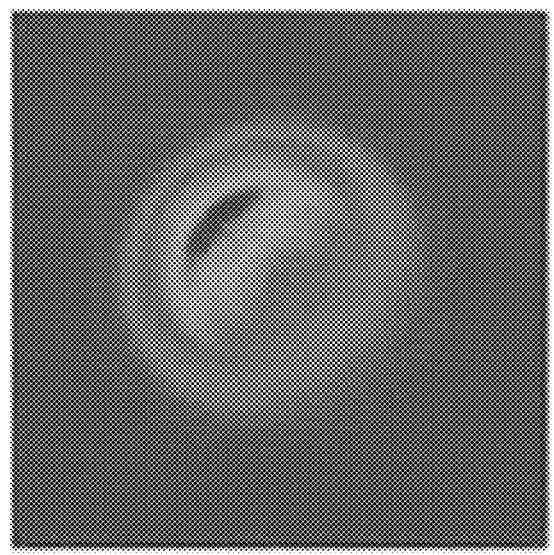
FIG. 9 is a cross-sectional view obtained by viewing the beam in cross-section A-A' of FIG. 8.
Figure 10:
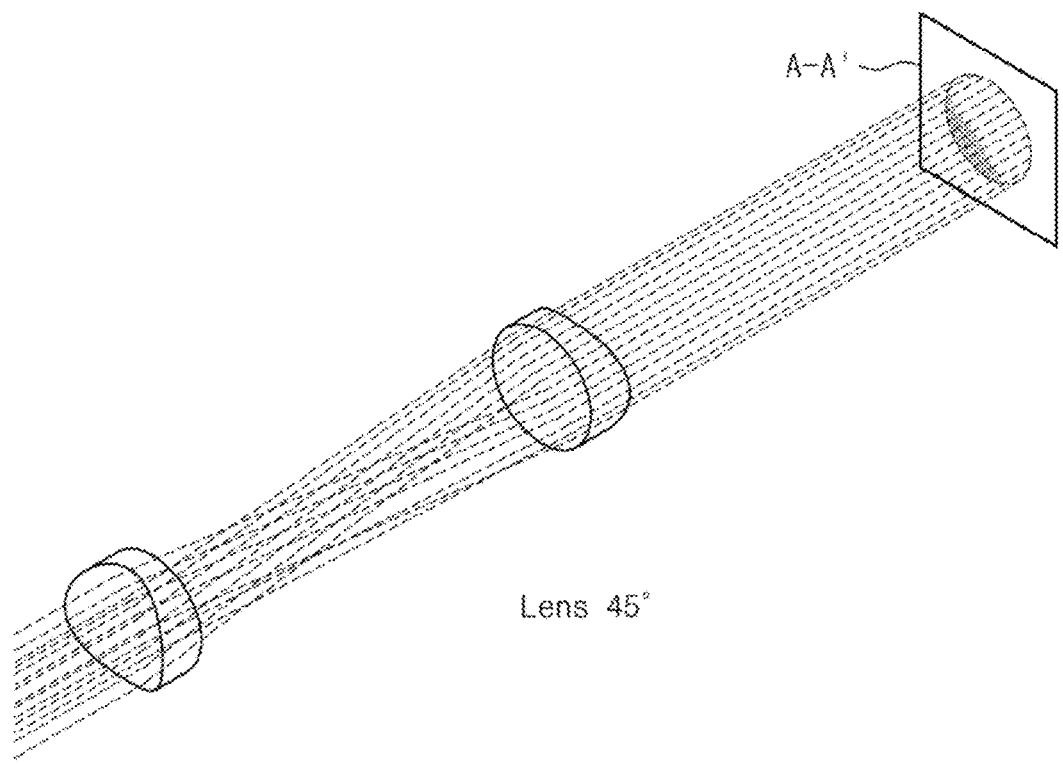
FIG. 10 is a conceptual view illustrating a travel of a beam when the cylindrical lenses are rotated by 45 degrees.
Figure 11:
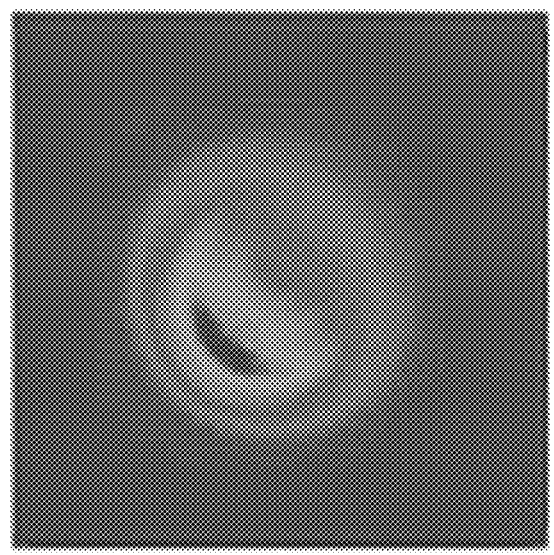
FIG. 11 is a cross-sectional view obtained by viewing the beam in cross-section A-A' of FIG. 10.
Figure 12:
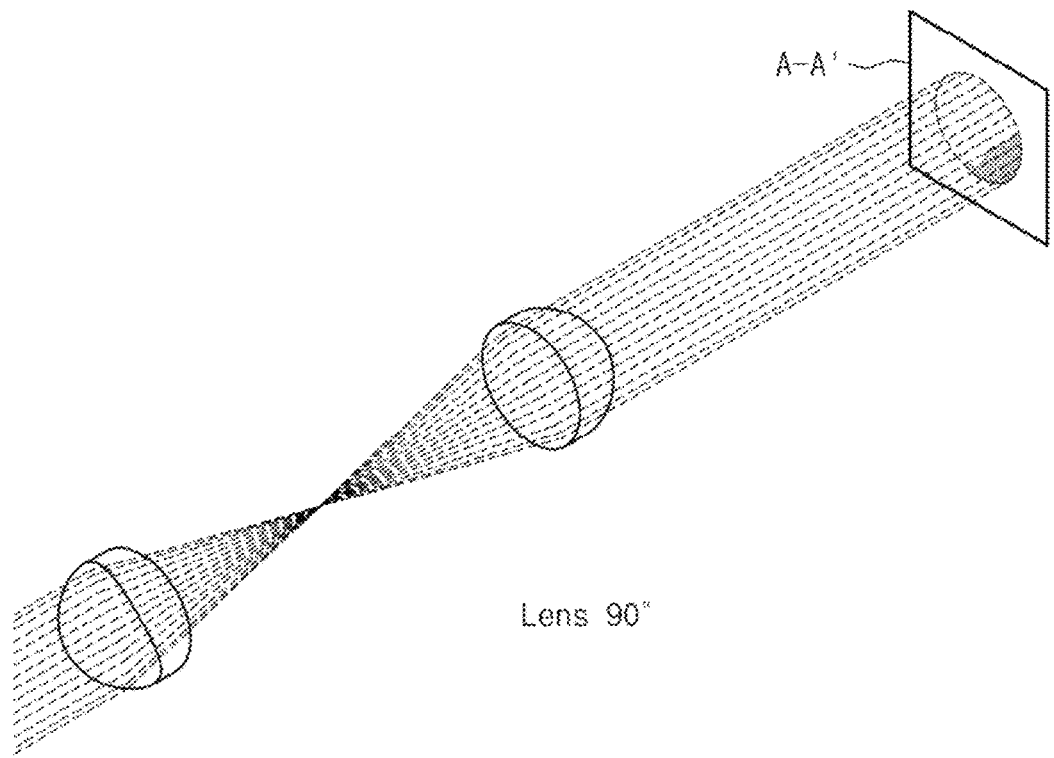
FIG. 12 is a conceptual view illustrating a travel of a beam when the cylindrical lenses are rotated by 90 degrees.
Figure 13:
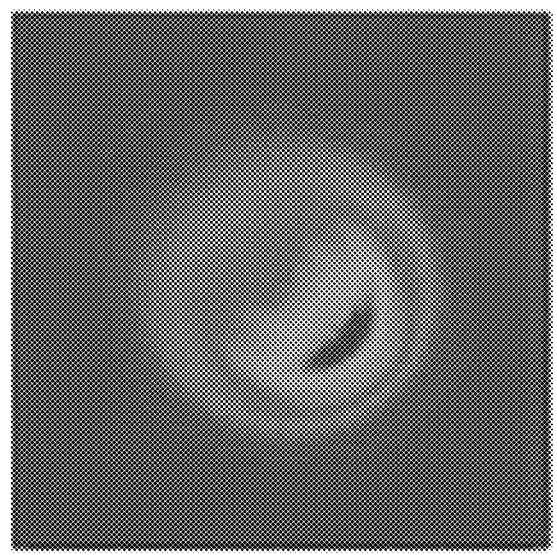
FIG. 13 is a cross-sectional view obtained by viewing the beam in cross-section A-A' of FIG. 12.
Figure 14:
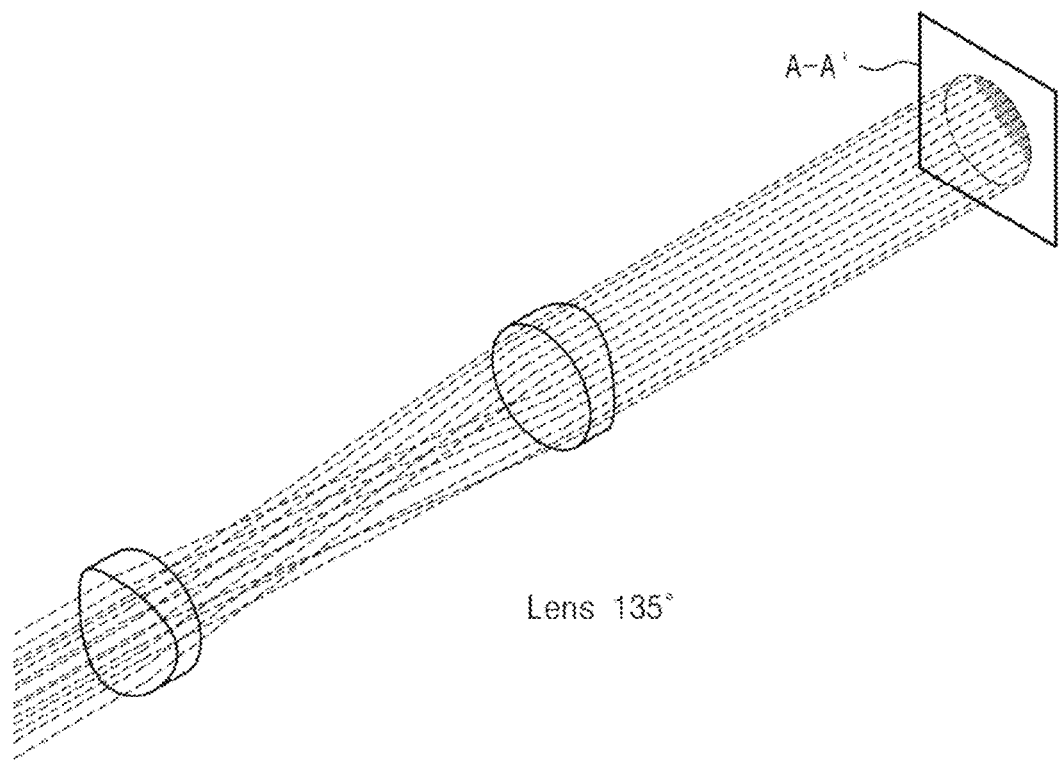
FIG. 14 is a conceptual view illustrating a travel of a beam when the cylindrical lenses are rotated by 135 degrees.
Figure 15:
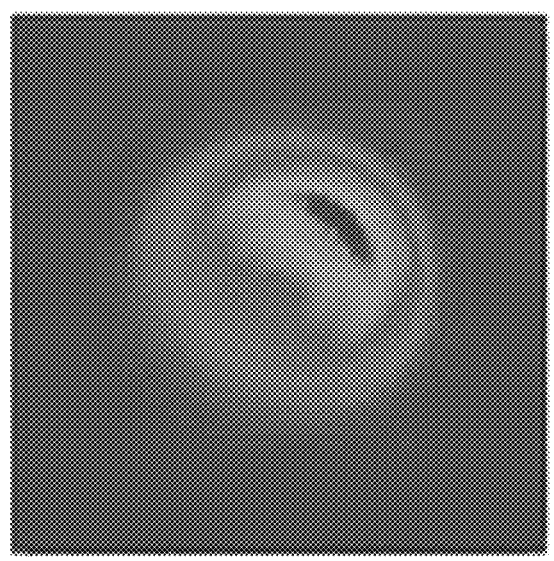
FIG. 15 is a cross-sectional view obtained by viewing the beam in cross-section A-A' of FIG. 14.

Furthermore, FIGS. 8 to 15 illustrate a state, in which the beam is viewed in cross-section A-A' according to the angles, by which the cylindrical lenses 149a and 149b are rotated. As may be seen with reference to FIGS. 8 to 15, the laser beam "L" is rotated by two cycles when the cylindrical lenses 149a and 149b are rotated by one cycle. For example, FIG. 8 illustrates a state, in which the cylindrical lenses 149a and 149b are rotated by 0 degrees, and FIG. 9 illustrates a state, in which the beam is viewed in cross-section A-A' when the cylindrical lenses 149a and 149b are rotated by 0 degrees. Furthermore, FIG. 10 illustrates a state, in which the cylindrical lenses 149a and 149b are rotated by 45 degrees, and FIG. 11 illustrates a state, in which the beam is viewed in cross-section A-A' when the cylindrical lenses 149a and 149b are rotated by 45 degrees. As may be seen in comparison of FIGS. 9 and 11, it may be identified that the beam is rotated by 90 degrees when the cylindrical lenses 149a and 149b are rotated by 45 degrees. Similarly, referring to FIGS. 12 and 13, it may be identified that the beam is rotated by 180 degrees when the cylindrical lenses 149a and 149b are rotated by 90 degrees. Furthermore, referring to FIGS. 14 and 15, it may be identified that the beam is rotated by 270 degrees when the cylindrical lenses 149a and 149b are rotated by 135 degrees. This is because the pair of cylindrical lenses 149a and 149b are provided.

That is, according to the embodiment of the inventive concept, the rotational speed of the beam corresponds to two times of the rotational speeds of the lenses 149a and 149b.

That is, as the rotation speed of the beam becomes higher, the heating uniformity for the substrate "S" may be further maximized.

Figure 16:
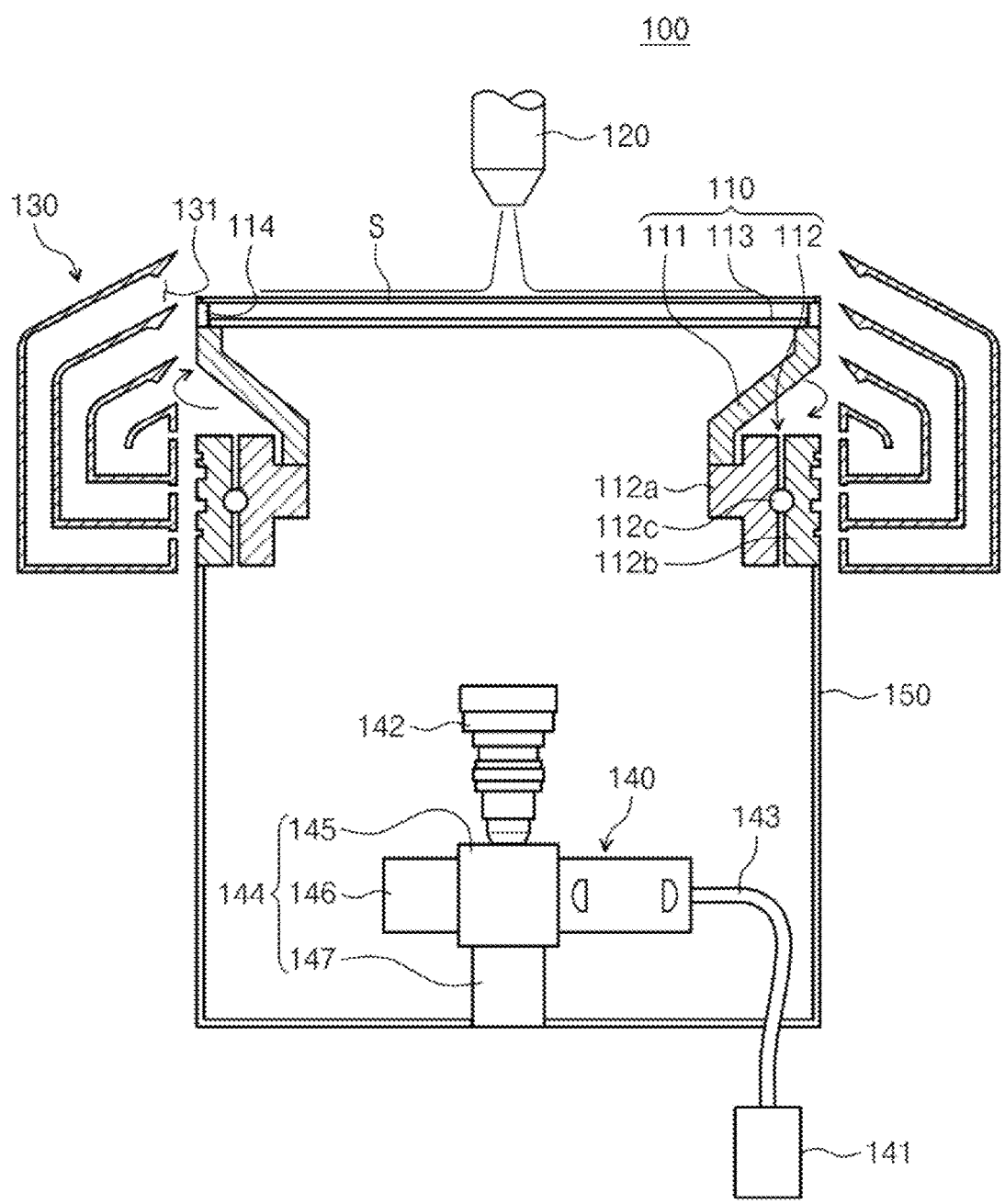
FIG. 16 is a view illustrating a state in which the substrate treating apparatus according to the embodiment of the inventive concept supplies a treatment liquid to a substrate.

FIG. 16 is a view illustrating a state in which the substrate treating apparatus according to the embodiment of the inventive concept supplies a treatment liquid to a substrate. Referring to FIGS. 16, the substrate treating apparatus 100 according to the embodiment of the inventive concept may supply the treatment liquid to the upper surface of the substrate "S" and treat the substrate "S" with the liquid. The liquid supply unit 120 may supply the treatment liquid to the upper surface of the substrate "S". While the liquid supply unit 120 supplies the treatment liquid, the rotation member 112 may rotate the support member 111. When the support member 111 is rotated, the substrate "S" supported by the chuck pin 114 installed in the support member 111 may be rotated. The treatment liquid supplied to the substrate "S" that is rotated may spatter from the substrate "S". The treatment liquid that spattered from the substrate "S" may be recovered through the inlet 131 of the bowl.

Figure 17:
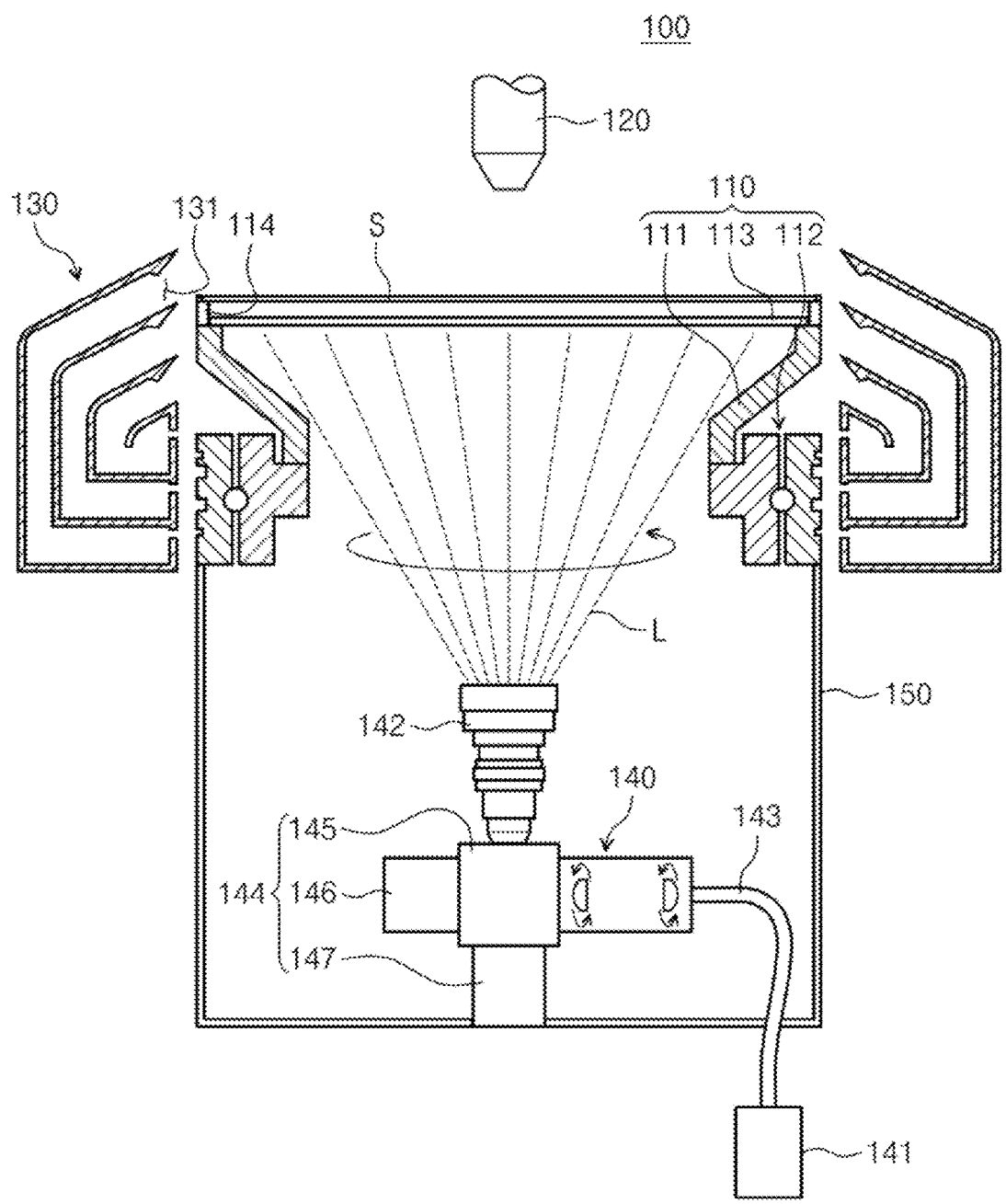
FIG. 17 is a view illustrating a state in which the substrate treating apparatus according to the embodiment of the inventive concept heats the substrate by irradiating the beam to the substrate.

FIG. 17 is a view illustrating a state in which the substrate treating apparatus according to the embodiment of the inventive concept heats the substrate by irradiating the beam to the substrate. Referring to FIG. 17, the heating unit 140 of the substrate treating apparatus 100 may heat the substrate "S" by irradiating the laser beam "L" to the lower surface of the substrate "S". The laser beam "L" irradiated by the heating unit 140 may be delivered to the lower surface of the substrate "S" after transmitting the transmission plate 113. The heating unit 140 may irradiate the laser beam "L" to the lower surface of the substrate "S" while the liquid supply unit 120 supplies the treatment liquid or after the liquid supply unit 120 finished supplying the treatment liquid. Then, as described above, the cylindrical lenses 149a and 149b may be rotated. Accordingly, the laser beam "L" also may be rotated, and uniform heating of the substrate "S" may be pursued.

A general substrate treating apparatus includes a spin chuck that supports and rotates a substrate, and a fixed heating lamp that is independent from rotation of the spin chuck. The general substrate treating apparatus generates an infrared ray with the heating lamp, and pursues uniform heating of the substrate by rotating the substrate. That is, the uniformity of the heating of the substrate is influenced by the rotation of the substrate.

However, according to the embodiment of the inventive concept, the laser beam "L" is rotated as the cylindrical lenses 149a and 149b are rotated. Accordingly, because the laser beam "L" is rotated even though the substrate "S" is not rotated, the substrate "S" and the laser beam "L" may be rotated with respect to each other. That is, in the embodiment of the inventive concept, the uniformity of the heating of the substrate "S" does not depend on the rotation of the substrate "S". Accordingly, the rotational speed of the substrate "S" may be freely adjusted regardless of the uniformity of the heating of the substrate "S". Because the rotational speed of the substrate "S" may be freely adjusted, the thickness of the liquid film formed by the treatment liquid supplied onto the substrate "S" may be adjusted to a desired thickness. Further, the flow velocity of the treatment liquid supplied onto the substrate "S" may be adjusted to a desired flow velocity. That is, according to the embodiment of the inventive concept, because the uniformity of the heating may be maintained regardless of the rotational speed of the substrate "S", such as a wafer, there is a very good advantage during development of a process that is sensitive to the rotational speed of the substrate "S".

Although it has been described as an example, in the above-described example, that the planar surfaces of the cylindrical lenses 149a and 149b are configured to face each other, the present disclosure is not limited thereto. For example, the curved surfaces of the cylindrical lenses 149a and 149b may be configured to face each other. Unlike this, a planar surface of any one of the cylindrical lenses 149a and 149b and a curved surface of the other of the cylindrical lenses 149a and 149b may be configured to face each other.

According to an embodiment of the inventive concept, the substrate may be efficiently treated.

Further, according to an embodiment of the inventive concept, the substrate may be efficiently heated.

Furthermore, according to an embodiment of the inventive concept, the heating uniformity of the substrate may be increased.

Furthermore, according to an embodiment of the inventive concept, the heating uniformity of the substrate may be increased while the substrate is not rotated.

Furthermore, according to an embodiment of the inventive concept, generation of a deviation in the thickness of the liquid film formed on the substrate may be minimized.

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
    a support unit configured to support a substrate; and
    a heating unit configured to irradiate a beam to the substrate and heat the substrate,
    wherein the heating unit further includes:
    an irradiation part configured to irradiate the beam; and
    a rotation part configured to rotate the beam and including a pair of cylindrical lenses located on a travel path of the beam irradiated by the irradiation part; wherein the pair of cylindrical lenses are configured to be rotatable and rotational directions of the pair of cylindrical lenses are the same;
    wherein the support unit and the heating unit are arranged on the same side with respect to the substrate.

2. The substrate treating apparatus of claim 1, wherein each of the cylindrical lenses has a shape, one surface of which is a planar surface that is flat, and an opposite surface of which is a curved surface.

3. The substrate treating apparatus of claim 2, wherein the planar surface of any one of the pair of cylindrical lenses and the planar surface of the other of the pair of cylindrical lenses face each other.

4. The substrate treating apparatus of claim 1, wherein the heating unit further includes:
a reflection part configured to reflect the beam that passed through the rotation part in a direction that faces the substrate.

5. The substrate treating apparatus of claim 4, wherein the reflection part includes:
a reflective mirror, of which a surface, to which the beam is input, has a flat or deflected shape.

6. The substrate treating apparatus of claim 5, wherein the heating unit further includes:
a dispersion part configured to disperse the beam reflected by the reflection part.

7. The substrate treating apparatus of claim 6, wherein the dispersion part includes:'
a lens barrel; and
one or more dispersion lenses housed in the lens barrel.

8. The substrate treating apparatus of claim 7, wherein a plurality of dispersion lenses are provided, and a relative distance of the plurality of dispersion lenses is variable.

9. The substrate treating apparatus of claim 8, wherein the support unit further includes:
a transmission plate formed of a transparent material; and
a chuck pin configured to chuck the substrate while an upper surface of the transmission plate and a lower surface of the substrate are spaced apart from each other, and
wherein the beam irradiated by the irradiation part is irradiated to the lower surface of the substrate.

10. The substrate treating apparatus of claim 9, wherein the support unit further includes:
a support member configured to support an edge of the transmission plate; and
a rotation member configured to rotate the support member.

11. A substrate treating apparatus comprising:
a support unit configured to support a substrate and optionally rotate the substrate;
a liquid supply unit configured to supply a treatment liquid to the substrate; and
a heating unit configured to irradiate a beam to the substrate and heat the substrate, and
wherein the heating unit includes:
an irradiation part configured to irradiate the beam; and
a rotation part configured to rotate the beam and including a pair of cylindrical lenses located on a travel path of the beam irradiated by the irradiation part; wherein the pair of cylindrical lenses are configured to be rotatable and rotational directions of the pair of cylindrical lenses are the same;
wherein the support unit and the heating unit are arranged on the same side with respect to the substrate.

12. The substrate treating apparatus of claim 11, wherein the support unit further includes:
a transmission plate formed of a transparent material; and
a chuck pin configured to chuck the substrate while an upper surface of the transmission plate and a lower surface of the substrate are spaced apart from each other, and
wherein the beam irradiated by the irradiation part is irradiated to the lower surface of the substrate.

13. The substrate treating apparatus of claim 12, wherein the support unit further includes:
a support member configured to support an edge of the transmission plate; and
a rotation member configured to rotate the support member.

14. The substrate treating apparatus of claim 11, wherein each of the cylindrical lenses has a shape, one surface of which is a planar surface that is flat, and an opposite surface of which is a curved surface.

15. A substrate treating apparatus comprising:
a support member configured to support a substrate and formed of a transparent material; and
a heating unit configured to heat the substrate by irradiating a laser beam to a lower surface of the substrate supported by the support member,
wherein the heating unit includes:
an irradiation part configured to irradiate the laser beam; and
a rotation part configured to rotate the laser beam, and
wherein the rotation part includes:
a cylindrical lens located on a travel path of the laser beam irradiated by the irradiation part and configured to be rotatable.

16. The substrate treating apparatus of claim 15, wherein rotational directions of the cylindrical lenses are the same, and
wherein each of the cylindrical lenses has a shape, one surface of which is a planar surface that is flat, and an opposite surface of which is a curved surface.

* * * * *